United States Patent
Narayanaswami et al.

(10) Patent No.: US 9,880,976 B2
(45) Date of Patent: *Jan. 30, 2018

(54) MATRIX PROCESSING APPARATUS

(71) Applicant: Google Inc., Mountain View, CA (US)

(72) Inventors: Ravi Narayanaswami, San Jose, CA (US); Rahul Nagarajan, Sunnyvale, CA (US); Dong Hyuk Woo, San Jose, CA (US); Christopher Daniel Leary, Mountain View, CA (US)

(73) Assignee: Google LLC, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/389,386

(22) Filed: Dec. 22, 2016

(65) Prior Publication Data

US 2017/0228344 A1    Aug. 10, 2017

Related U.S. Application Data

(63) Continuation of application No. 15/016,486, filed on Feb. 5, 2016.

(51) Int. Cl.
    *G06F 17/16* (2006.01)
    *G06F 17/14* (2006.01)

(52) U.S. Cl.
    CPC .............. *G06F 17/16* (2013.01); *G06F 17/14* (2013.01)

(58) Field of Classification Search
    CPC .......................... G06F 17/16; G06F 2212/454
    See application file for complete search history.

(56) References Cited

U.S. PATENT DOCUMENTS

| | | |
|---|---|---|
| 5,625,836 A | 4/1997 | Barker et al. |
| 5,644,517 A | 7/1997 | Ho |
| 5,655,137 A | 8/1997 | Kevorkian |
| 5,708,836 A | 1/1998 | Wilkinson |
| 6,249,614 B1 * | 6/2001 | Kolesnik ................ H04N 19/63 375/240.11 |
| 7,587,516 B2 | 9/2009 | Bhanot |
| 8,250,133 B2 | 8/2012 | Blumrich et al. |
| 8,549,259 B2 | 10/2013 | Archer et al. |
| 8,751,556 B2 | 6/2014 | Song |

(Continued)

FOREIGN PATENT DOCUMENTS

CN            102141976           8/2011

OTHER PUBLICATIONS

Bell et al. "Efficient Sparse Matrix Vector Multiplication on CUDA," vol. 2 No. 5 Nividia Technical Report NVR-2008-004, Dec. 11, 2008, 32 pages.
Search Report and Written Opinion in Singaporan Application No. 10201610912U, dated Aug. 15, 2017, 10 pages.

(Continued)

*Primary Examiner* — Chuong D Ngo
(74) *Attorney, Agent, or Firm* — Fish & Richardson P.C.

(57) ABSTRACT

Methods, systems, and apparatus, including a system for transforming sparse elements into a dense matrix. The system includes a data fetch unit that includes a plurality of processors, the data fetch unit configured to determine, based on identifications of the subset of the particular sparse elements, a processor designation for fetching the subset of the particular sparse elements. The system includes a concatenation unit configured to generate an output dense matrix based on a transformation that is applied to the sparse elements fetched by the data fetch unit.

17 Claims, 9 Drawing Sheets

(56) References Cited

U.S. PATENT DOCUMENTS

| | | | |
|---|---|---|---|
| 2004/0153934 A1 | 8/2004 | Jin et al. | |
| 2006/0072834 A1* | 4/2006 | Lynch | H03M 7/46 |
| | | | 382/232 |
| 2012/0159489 A1* | 6/2012 | Schabenberger | G06F 17/16 |
| | | | 718/100 |
| 2013/0339506 A1 | 12/2013 | George et al. | |
| 2015/0067009 A1* | 3/2015 | Strauss | G06F 17/16 |
| | | | 708/203 |
| 2015/0169369 A1 | 6/2015 | Baskaran et al. | |
| 2015/0378962 A1 | 12/2015 | Golovashkin et al. | |
| 2015/0379054 A1 | 12/2015 | Kernert et al. | |
| 2016/0127405 A1* | 5/2016 | Kasahara | H04L 63/1425 |
| | | | 726/23 |

OTHER PUBLICATIONS

Cherkassky et al. "Efficient mapping and implementation of matrix algorithms on a hypercube," Journal on a hypercube, 2(1), Sep. 1, 1988, 21 pages.

Extended European Search Report issued in European Application No. 16207246.6 dated Jul. 6, 2017, 10 pages.

Morad et al. "Efficient Dense and Sparse Matrix Multiplication on GP-SIMD," $24^{th}$ International Workshop on Power and Timing Modeling, Optimization and Simulation, Sep. 29, 2014, 8 pages.

Zhang et al. "Impact and Application of Data Mining Algorithms Tuned Graph Representation Format for GraphChi," The $8^{th}$ ACM Conference on Recommender Systems, Oct. 6, 2014, 4 pages.

Office Action issued in Taiwanese Application No. 105143865, dated Sep. 12, 2017, 3 pages (English translation).

* cited by examiner

MATRIX PROCESSING APPARATUS

CROSS-REFERENCE TO RELATED APPLICATION

This application is a continuation of and claims priority to U.S. application Ser. No. 15/016,486, filed on Feb. 5, 2016, the contents of which are incorporated by reference.

BACKGROUND

This specification generally relates to using circuitry to process a matrix.

SUMMARY

According to one innovative aspect of the subject matter described in this specification, a matrix processor can be used to perform a sparse-to-dense or a dense-to-sparse matrix transformation. In general, high performance computing systems may use linear algebra routines to process a matrix. In some instances, the size of the matrix may be too large to fit in one data storage, and different portions of the matrix may be sparsely stored in different locations of a distributed data storage system. To load the matrix, the central processing unit of a computing system may instruct multiple matrix processors to access different portions of the matrix. Each matrix processor may gather sparse data, to perform concurrent computation on the sparse data, and to generate a dense matrix that can be concatenated together for the central processing unit to perform further processing.

In general, one innovative aspect of the subject matter described in this specification can be embodied in a system for transforming sparse elements into a dense matrix. The system includes a request identification unit configured to receive, over a node network, a request for particular sparse elements that are stored in one or more data shards; determine that the system is assigned to handle a subset of the particular sparse elements; and in response to determining that the system is assigned to handle a subset of the particular sparse elements, generate an indication for accessing the subset of the particular sparse elements. The system includes a data fetch unit that includes a plurality of processors, the data fetch unit configured to receive, from the request identification unit, the indication for accessing the subset of the particular sparse elements; determine, based on identifications of the subset of the particular sparse elements, a processor designation for fetching the subset of the particular sparse elements; fetch, based on the designation and by a first processor of the plurality of processors, a first sparse element of the subset of the particular sparse elements; and fetch, based on the designation and by a second processor of the plurality of processors, a second sparse element of the subset of the particular sparse elements. The system includes a concatenation unit configured to generate an output dense matrix based on a transformation that is applied to at least the first sparse element and the second sparse element.

These and other implementations can each optionally include one or more of the following features. For example, the system may include a sparse reduce unit configured to receive a first matrix that includes the first sparse element from the first processor, the first matrix having a first dimension; and generate a second matrix that includes the first sparse element, the second matrix having a second dimension that is smaller than the first dimension. The concatenation unit may be further configured to receive the second matrix. To generate the output dense matrix, the output dense matrix may be generated based on the second matrix.

The concatenation unit may be configured to receive the first sparse element at a first point of time; receive the second sparse element at a second, different, point of time; and determine an order of the first sparse element and the second sparse element for the output dense matrix. To generate the output dense matrix, the output dense matrix may be generated based on the order of the first sparse element and the second sparse element.

The system may include a compress/decompress unit configured to compress the output dense matrix to generate a compressed output dense matrix, and provide the compressed output dense matrix to a node network. The concatenation unit may be further configured to receive a first dense matrix representing a dense matrix sent over the node network. To generate the output dense matrix, the output dense matrix may be generated based on the first dense matrix, the first sparse element, and the second sparse element. The compress/decompress unit may be configured to decompress a compressed first dense matrix to generate the first dense matrix.

To determine that the system is assigned to handle the subset of the particular sparse elements, the data fetch unit may be configured to determine that the system is assigned to handle a subset of the particular sparse elements based on a lookup table. The one or more sparse elements of the particular sparse elements may be multi-dimensional matrices, and the output dense matrix may be a vector.

The subject matter described in this specification can be implemented in particular embodiments so as to realize one or more of the following advantages. Shifting the sparse-to-dense data loading task from the central processing unit to specialized matrix processors increases the computation bandwidth of the central processing unit and decreases the processing cost of the system. The matrix processors can be arranged to be near the memory where the data is stored, and can lower the latency for loading data. By using specialized matrix processors, the use of processors that are specialized for dense linear algebra to fetch sparse data can be avoided. By having multiple units per-controller-channel, the number of simultaneous transactions that are being serviced at a time may be parallelized, and transactions may be processed immediately without waiting for a previous transaction to complete.

Other implementations of this and other aspects include corresponding systems, apparatus, and computer programs, configured to perform the actions of the methods, encoded on computer storage devices. A system of one or more computers can be so configured by virtue of software, firmware, hardware, or a combination of them installed on the system that in operation cause the system to perform the actions. One or more computer programs can be so configured by virtue of having instructions that, when executed by data processing apparatus, cause the apparatus to perform the actions.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

In general, data can be represented in the form of a matrix and a computing system may manipulate the data using linear algebra algorithms. A matrix may be a one-dimensional vector or a multi-dimensional matrix. A matrix may be represented by a data structure, such as a database table or a variable. However, when the size of a matrix is too large, it may not be possible to store the entire matrix in one data storage. A dense matrix may be transformed into multiple sparse elements, where each sparse element may be stored in a different data storage. A sparse element of a dense matrix may be a matrix where only a small sub-matrix of the matrix (e.g., a single-value element, a row, a column, or a sub-matrix) have non-zero values. When a computing system needs to access the dense matrix, the central processing unit (CPU) may start a thread that reaches to each of the data storage to fetch the stored sparse elements, and applies a sparse-to-dense transform to get back the dense matrix. However, the amount of time it takes to fetch all the sparse elements may be long, and the computation bandwidths of the CPU may be under-utilized as the result. In some cases, a computing system may need to access sparse elements of several dense matrices to form a new dense matrix, where the dense matrices may not have equal dimensions. The CPU idle time associated with a thread reaching to each of the data storage to fetch sparse elements of different dense matrices may encounter different waiting time, and may further impact the performance of the computing device in an undesirable manner. In some cases, a computing system may need to access sparse elements of several dense matrices to form a new dense matrix, where the sparse elements may not have equal dimensions. The CPU idle time associated with a thread reaching to each of the data storage to fetch sparse elements of different dense matrices may encounter different waiting time, and may further impact the performance of the computing device in an undesirable manner. A hardware sparse-dense transform unit that is separate from a CPU may increase the computation bandwidth of the processor by collecting sparse elements and transforming the sparse element into a dense matrix independent of the CPU operations.

Figure 1:
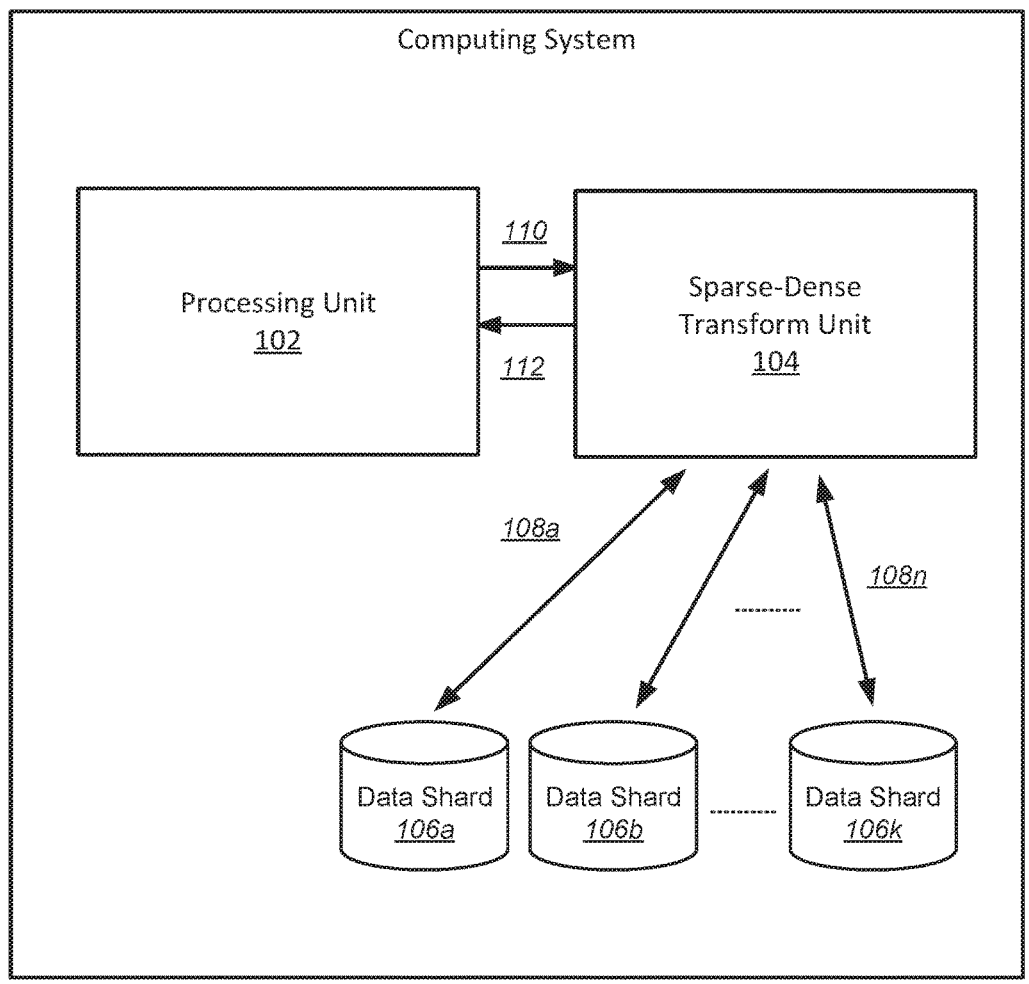
FIG. 1 is a block diagram of an example computation system.

FIG. 1 shows a block diagram of an example computing system 100 for transforming sparse elements from one or more dense matrices to generate a dense matrix. The computing system 100 includes a processing unit 102, a sparse-dense transform unit 104, and data shards 106a-106k, where k is an integer greater than one. In general, the processing unit 102 processes an instruction for accessing a target dense matrix, and sends an instruction 110 to the sparse-dense transform unit 104 to generate the target dense matrix. The sparse-dense transform unit 104 accesses the corresponding sparse elements 108a-108n from one or more of the data shards 106a-106k, where n is an integer greater than one. The sparse-dense transform unit 104 generates the target dense matrix 112 using the corresponding sparse elements 108a-108n, and provides the target dense matrix 112 to the processing unit 102 for further processing. For example, the sparse elements 108a-108n may be two-dimensional matrices having different sizes, and the sparse-dense transform unit 104 may generate the target dense matrix 112 by transforming each of the sparse elements 108a-108n into a vector, and concatenating the n vectors into a single vector.

In some implementations, the processing unit 102 may process an instruction for updating a target dense matrix and send an updated dense matrix to the sparse-dense transform unit 104. The sparse-dense transform unit 104 may transform the updated dense matrix into corresponding sparse elements and update one or more sparse elements stored in the data shards 106a-106k accordingly.

The processing unit 102 is configured to process instructions for execution within the computing system 100. The processing unit 102 may include one or more processors. In some implementations, the processing unit 102 is configured to process the target dense matrix 112 generated by the sparse-dense transform unit 104. In some other implementations, the processing unit 102 may be configured to request the sparse-dense transform unit 104 to generate the target dense matrix 112, and another processing unit may be configured to process the target dense matrix 112. The data shards 106a-106k store data including sparse elements 108a-108n. In some implementations, the data shards 106a-106k may be a volatile memory unit or units. In some other implementations, the data shards 106a-106k may be a non-volatile memory unit or units. The data shards 106a-106k may also be another form of computer-readable medium, such as devices in a storage area network or other configurations. The data shards 106a-106k may be coupled to the sparse-dense transform unit 104 using electrical connections, optical connections, or wireless connections. In some implementations, the data shards 106a-106k may be part of the sparse-dense transform unit 104.

The sparse-dense transform unit 104 is configured to determine a dense matrix based on sparse elements. In some implementations, the sparse-dense transform unit 104 may be configured to determine locations of sparse elements based on a dense matrix. In some implementations, the sparse-dense transform unit 104 may include multiple interconnected sparse element access units, as described in more detail below with reference to FIGS. 2A-2D.

Figure 2A:
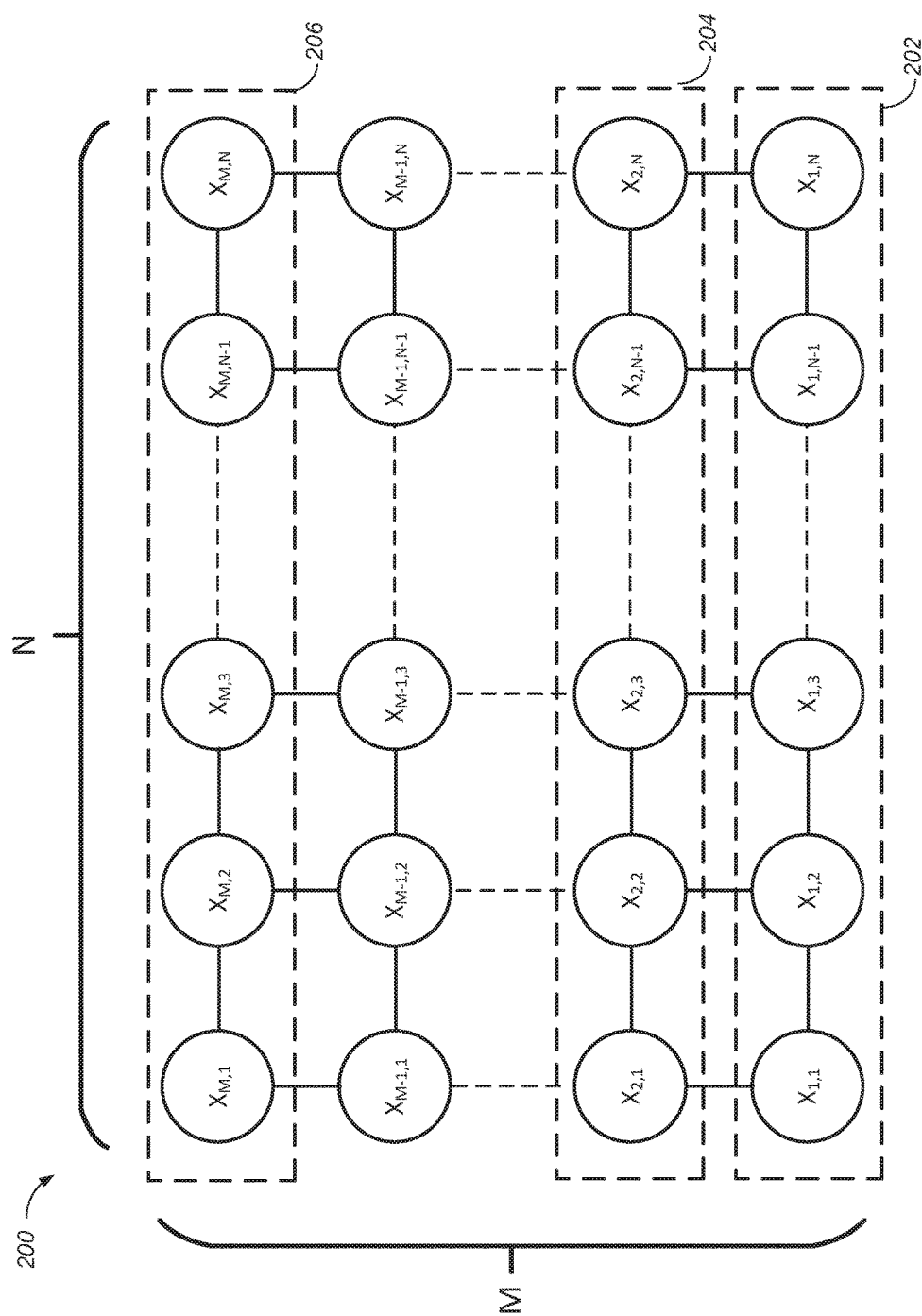
FIGS. 2A-2D illustrate an example sparse-dense transform unit.

FIG. 2A shows an example sparse-dense transform unit 200. The sparse-dense transform unit 200 may correspond to the sparse-dense transform unit 104. The sparse-dense transform unit 200 includes M-by-N sparse element access units $X_{1,1}$ to $X_{M,N}$ that are physically or logically arranged into M rows and N columns, where M and N are integers that are equal to or greater than 1. In some implementations, the sparse-dense transform unit 200 may include additional circuitry configured to process data. In general, the sparse-dense transform unit 200 is configured to receive a request for a dense matrix, and to determine a dense matrix based on corresponding sparse elements that are accessible by sparse element access units $X_{1,1}$ to $X_{M,N}$. In general, each sparse element access unit is configured to access a designated set of sparse elements, and is described in more detail below with reference to FIGS. 3A-3B. In some implementations, a sparse element access unit may be a single instruction, multiple data (SIMD) processing device.

In some implementations, the sparse element access units $X_{1,1}$ to $X_{M,N}$ may be physically or logically arranged into a two-dimensional mesh configuration. For example, the sparse element access unit $X_{1,1}$ is directly coupled to the sparse element access units $X_{1,2}$ and $X_{2,1}$. As another example, the sparse element access unit $X_{2,2}$ is directly coupled to the sparse element access units $X_{2,1}$, $X_{3,1}$, $X_{2,3}$, and $X_{1,2}$. The coupling between two sparse element access units may be an electrical connection, an optical connection, a wireless connection, or any other suitable connection.

In some other implementations, the sparse element access units $X_{1,1}$ to $X_{M,N}$ may be physically or logically arranged into a two-dimensional torus configuration. For example, the sparse element access unit $X_{1,1}$ is directly coupled to the sparse element access units $X_{1,2}$, $X_{2,1}$, $X_{1,N}$, and $X_{M,1}$. As another example, the sparse element access unit $X_{M,N}$ is directly coupled to the sparse element access units $X_{M,N-1}$, $X_{M-1,N}$, $X_{M,1}$, and $X_{1,N}$.

In some implementations, the sparse-dense transform unit 200 may be configured to partition the sparse elements transformed from dense matrices according to a set of predetermined conditions. Each row of the sparse element access units $X_{1,1}$ to $X_{M,N}$ may be partitioned to access sparse elements transformed from specific dense matrices. For example, the sparse-dense transform unit 200 may be configured to access sparse elements transformed from dense matrices that correspond to 1,000 different database tables of a computer model. One or more of the database tables may have different sizes. The first row 202 of the sparse element access units may be configured to access sparse elements transformed from database table No. 1 to database table No. 100, the second row 204 of the sparse element access units may be configured to access sparse elements transformed from database table No. 101 to database table No. 300, and the M-th row 206 of the sparse element access units may be configured to access sparse elements transformed from database table No. 751 to database table No. 1,000. In some implementations, the partitions may be configured by hardware instructions before a processor accesses sparse elements using the sparse-dense transform unit 200.

Each column of the sparse element access units $X_{1,1}$ to $X_{M,N}$ may be partitioned to access a subset of the sparse elements transformed from the specific dense matrices. For example, the dense matrix corresponding to database table No. 1 may be transformed into 1,000 sparse elements, where the 1,000 sparse elements are accessible by the first row 202 as described above. The sparse element access unit $X_{1,1}$ may be configured to access sparse elements No. 1 to No. 200 of database table No. 1, and the sparse element access unit $X_{1,2}$ may be configured to access sparse elements No. 201 to No. 500 of database table No. 1. As another example, the dense matrix corresponding to database table No. 2 may be transformed into 500 sparse elements, where the 500 sparse elements are accessible by the first row 202 as described above. The sparse element access unit $X_{1,1}$ may be configured to access sparse elements No. 1 to No. 50 of database table No. 2, and the sparse element access unit $X_{1,2}$ may be configured to access sparse elements No. 51 to No. 200 of database table No. 2. As another example, the dense matrix corresponding to database table No. 1,000 may be transformed into 10,000 sparse elements, where the 10,000 sparse elements are accessible by the M-th row 206 as described above. The sparse element access unit $X_{M,1}$ may be configured to access sparse elements No. 1 to No. 2,000 of database table No. 1,000, and the sparse element access unit $X_{M,N}$ may be configured to access sparse elements No. 9,000 to No. 10,000 of database table No. 1,000.

Figure 2B:
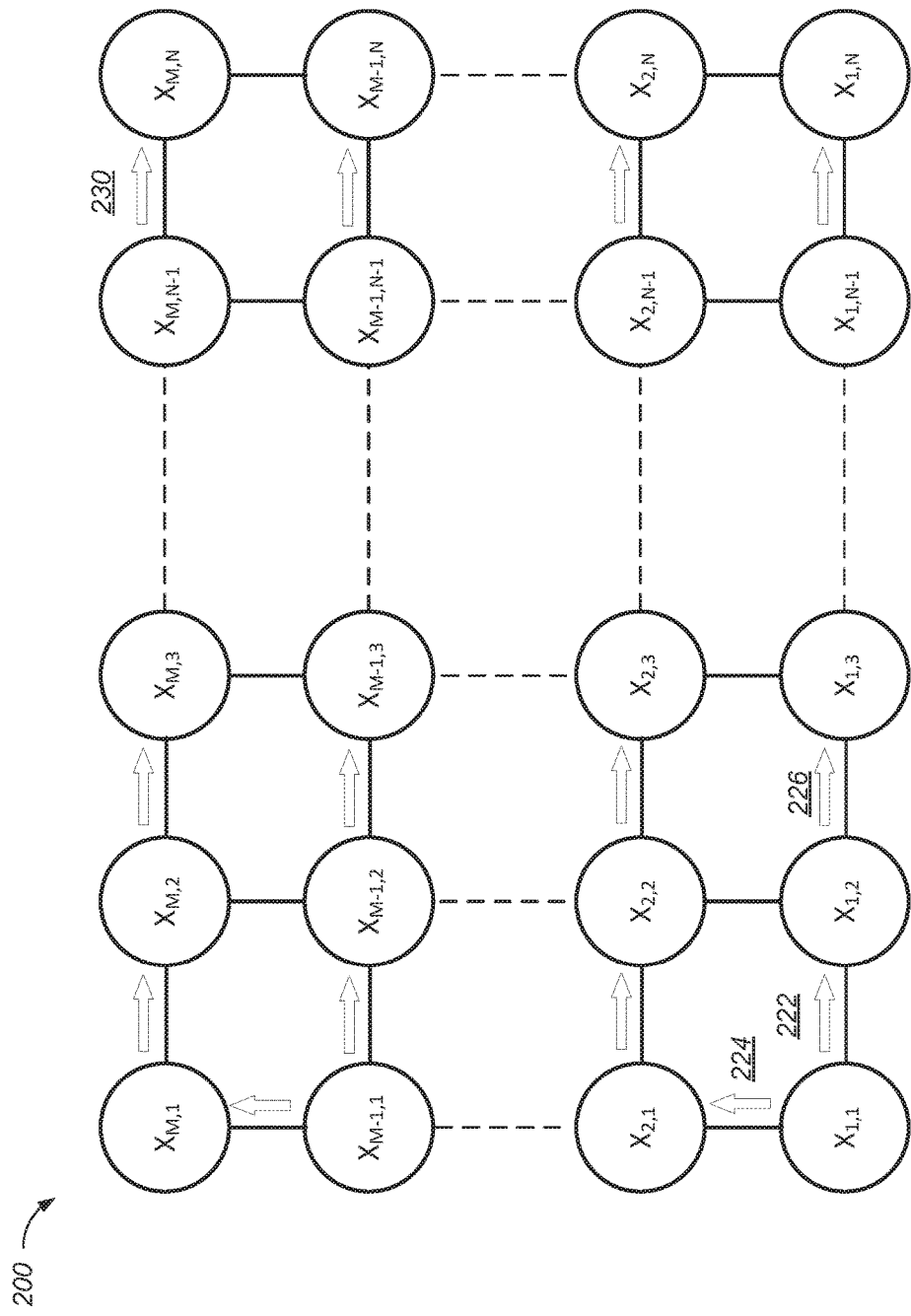

FIG. 2B shows an example of how the sparse-dense transform unit 200 may request sparse elements using a two-dimensional mesh network of the sparse element access units. As an example, a processing unit may execute an instruction requesting the sparse-dense transform unit 200 for a dense one-dimensional vector generated using sparse elements No. 1 to No. 50 of database table No. 1, sparse elements No. 100 to No. 200 of database table No. 2, and sparse elements No. 9,050 to No. 9,060 of database table No. 1,000. After the sparse-dense transform unit 200 receives the request from the processing unit, the sparse-dense transform unit 200 may instruct the sparse element access unit $X_{1,1}$ to broadcast a request for the sparse elements to the other sparse element access units in the mesh network. The sparse element access unit $X_{1,1}$ may broadcast a request 222 to the sparse element access unit $X_{1,2}$ and a request 224 to the sparse element access unit $X_{2,1}$. After receiving the request 222, the sparse element access unit $X_{1,2}$ may broadcast a request 226 to the sparse element access unit $X_{1,3}$. In some implementations, a sparse element access unit may be configured to broadcast a request to another sparse element access unit based on a routing scheme. For example, the sparse element access unit $X_{1,2}$ may not be configured to broadcast a request to the sparse element access unit $X_{2,2}$ because the sparse element access unit $X_{2,2}$ is configured to receive a broadcast from the sparse element access unit $X_{2,1}$. The routing scheme may be static or dynamically generated. For example, the routing scheme may be a lookup table. In some implementations, a sparse element access unit may be configured to broadcast the request 224 to another sparse element access unit based on the request 224. For example, the request 224 may include identifications of the requested sparse elements (e.g., database table No. 1, sparse elements No. 1 to No. 50), and the sparse element access unit $X_{1,2}$ may determine whether to broadcast the request 224 to the sparse element access unit $X_{2,2}$ and/or the sparse element access unit $X_{1,3}$ based on the identifications. The broadcast process propagates through the mesh network, where the sparse element access unit $X_{M,N}$ receives a request 230 from the sparse element access unit $X_{M,N-1}$.

Figure 2C:
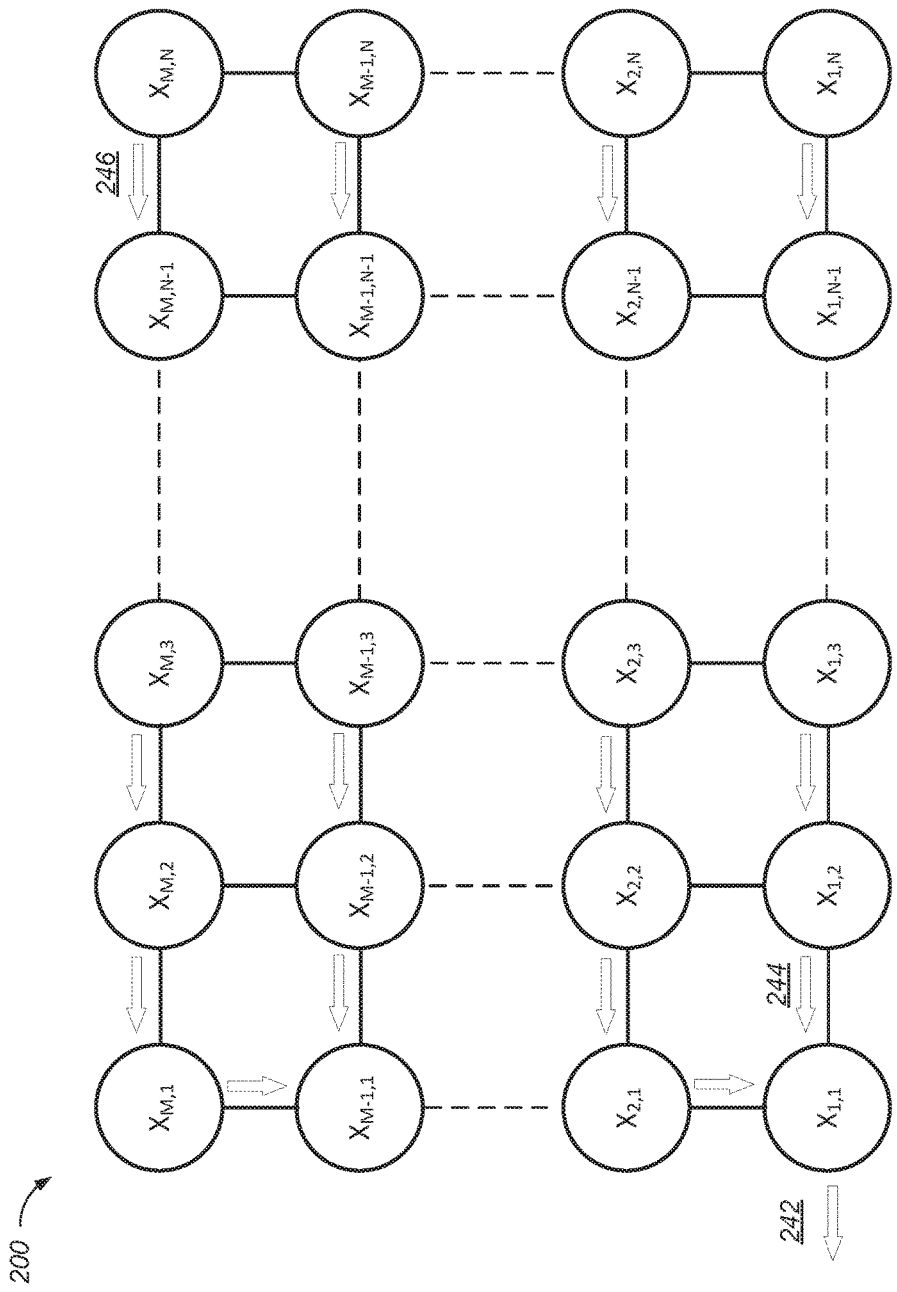

FIG. 2C shows an example of how the sparse-dense transform unit 200 may generate the requested dense matrix using the two-dimensional mesh network of the sparse element access units. In some implementations, after a sparse element access unit receives the broadcasted request, the sparse element access unit is configured to determine whether it is configured to access any of the requested sparse elements. For example, the sparse element access unit $X_{1,1}$ may determine that it is configured to access sparse elements No. 1 to No. 50 of database table No. 1, but it is not configured to access sparse elements No. 100 to No. 200 of database table No. 2 or sparse elements No. 9,050 to No. 9,060 of database table No. 1,000. In response to determining that it is configured to access sparse elements No. 1 to No. 50 of database table No. 1, the sparse element access unit $X_{1,1}$ may fetch sparse elements No. 1 to No. 50 of database table No. 1 from the data shard(s) where these sparse elements are being stored, and generate a dense matrix 242 based on these sparse elements.

As another example, the sparse element access unit $X_{2,1}$ may determine that it is not configured to access any of the sparse elements No. 1 to No. 50 of database table No. 1, the sparse elements No. 100 to No. 200 of database table No. 2, or sparse elements No. 9,050 to No. 9,060 of database table No. 1,000. In response to determining that it is not configured to access any of the requested sparse elements, the sparse element access unit $X_{2,1}$ may perform no further action.

As another example, the sparse element access unit $X_{1,2}$ may determine that it is configured to access sparse elements No. 100 to No. 200 of database table No. 2, but it is not configured to access sparse elements No. 1 to No. 50 of database table No. 1 or sparse elements No. 9,050 to No. 9,060 of database table No. 1,000. In response to determining that it is configured to access sparse elements No. 100 to No. 200 of database table No. 2, the sparse element access unit $X_{1,2}$ may fetch these sparse elements from the data shard(s) where these sparse elements are being stored, and generate a dense matrix 244 based on these sparse elements. In some implementations, after a sparse element access unit generates a dense matrix, the sparse element access unit may be configured to forward the dense matrix to the sender of the broadcast request. Here, the sparse element access unit $X_{1,2}$ forwards the dense matrix 244 to the sparse element access unit $X_{1,1}$.

As another example, the sparse element access unit $X_{M,N}$ may determine that it is configured to access sparse elements No. 9,050 to No. 9,060 of database table No. 1,000, but it is not configured to access sparse elements No. 1 to No. 50 of database table No. 1 or sparse elements No. 100 to No. 200 of database table No. 2. In response to determining that it is configured to access sparse elements No. 9,050 to No. 9,060 of database table No. 1,000, the sparse element access unit $X_{M,N}$ may fetch these sparse elements from the data shard(s) where these sparse elements are being stored, and generate a dense matrix 246 based on these sparse elements. In some implementations, after a sparse element access unit generates a dense matrix, the sparse element access unit may be configured to forward the dense matrix to the sender of the broadcast request. Here, the sparse element access unit $X_{M,N}$ forwards the dense matrix 246 to the sparse element access unit $X_{M,N-1}$. In the next cycle, the sparse element access unit $X_{M,N-1}$ is configured to forward the dense matrix 246 to the sparse element access unit $X_{M,N-1}$. This process continues until the sparse element access unit $X_{2,1}$ has forwarded the dense matrix 246 to the sparse element access unit $X_{1,1}$.

In some implementations, the sparse-dense transform unit 200 is configured to transform the dense matrices generated by the sparse element access units and generate a dense matrix for the processor unit. Here, the sparse-dense transform unit 200 transforms the dense matrices 242, 244, and 246 into a dense matrix for the processor unit. For example, the dense matrix 242 may have dimensions of 100-by-10, the dense matrix 244 may have dimensions of 20-by-100, and the dense matrix 246 may have dimensions of 3-by-3. The sparse-dense transform unit 200 may transform the dense matrices 242, 244, and 246 into a vector with dimensions of 1-by-3009. Advantageously, the partitioning of the rows according to dense matrices (e.g., database tables) allows the sparse-dense transform unit 200 to obtain all the requested sparse elements after the generated dense matrices has propagated from column N to column 1. The partitioning of the columns reduces bandwidth bottlenecks caused by accessing too many sparse elements using only one of the sparse element access units.

Figure 2D:
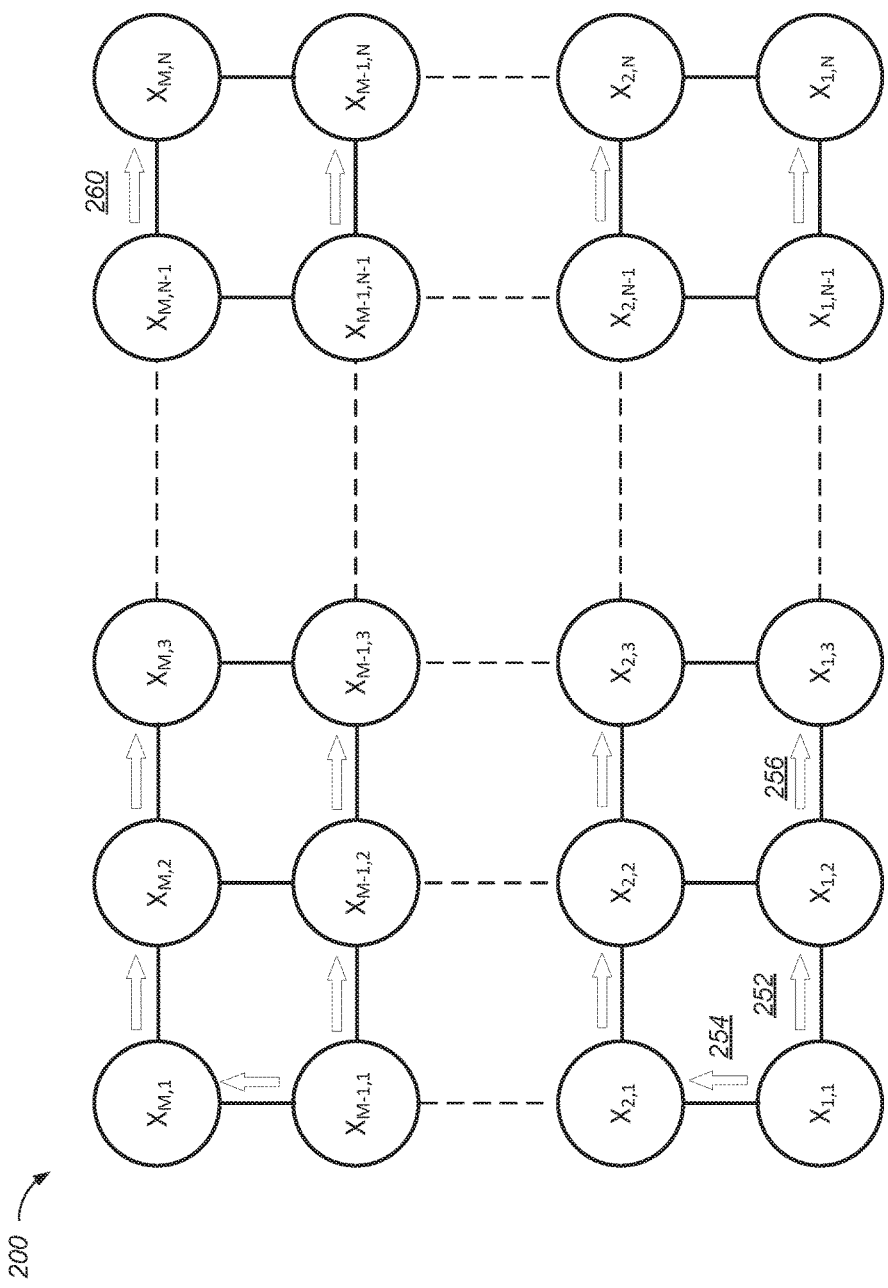

FIG. 2D shows an example of how the sparse-dense transform unit 200 may update sparse elements based on a dense matrix using a two-dimensional mesh network of the sparse element access units. As an example, a processing unit may execute an instruction requesting the sparse-dense transform unit 200 to update the stored sparse elements using a dense one-dimensional vector generated using sparse elements No. 1 to No. 50 of database table No. 1 and sparse elements No. 9,050 to No. 9,060 of database table No. 1,000. After the sparse-dense transform unit 200 receives the request from the processing unit, the sparse-dense transform unit 200 may instruct the sparse element access unit $X_{1,1}$ to broadcast a sparse elements update request to the other sparse element access units in the mesh network, where the sparse elements update request may include the dense one-dimensional vector provided by the processing unit. In some implementations, the sparse element access unit $X_{1,1}$ may determine whether it is assigned to access the sparse elements included in the dense one-dimensional vector. In response to determining that it is assigned to access the sparse elements included in the dense one-dimensional vector, the sparse element access unit $X_{1,1}$ may update the sparse elements stored in the data shard(s). Here, the sparse element access unit $X_{1,1}$ determines that it is assigned to access sparse elements No. 1 to No. 50 of database table No. 1, and the sparse element access unit $X_{1,1}$ executes an instruction to update these sparse elements in the data shard(s).

The sparse element access unit $X_{1,1}$ may broadcast a sparse elements update request 252 to the sparse element access unit $X_{1,2}$ and a sparse elements update request 254 to the sparse element access unit $X_{2,1}$. After receiving the sparse elements update request 252, the sparse element access unit $X_{1,2}$ may determine that it is not assigned to access the sparse elements included in the dense one-dimensional vector. The sparse element access unit $X_{1,2}$ broadcasts a request 256 to the sparse element access unit $X_{1,3}$. The broadcast process propagates through the mesh network, where the sparse element access unit $X_{M,N}$ receives a request 260 from the sparse element access unit $X_{M,N-1}$. Here, the sparse element access unit $X_{M,N}$ determines that it is assigned to access sparse elements No. 9,050 to No. 9,060 of database table No. 1,000, and the sparse element access unit $X_{M,N}$ executes an instruction to update these sparse elements in the data shard(s).

Figure 3A:
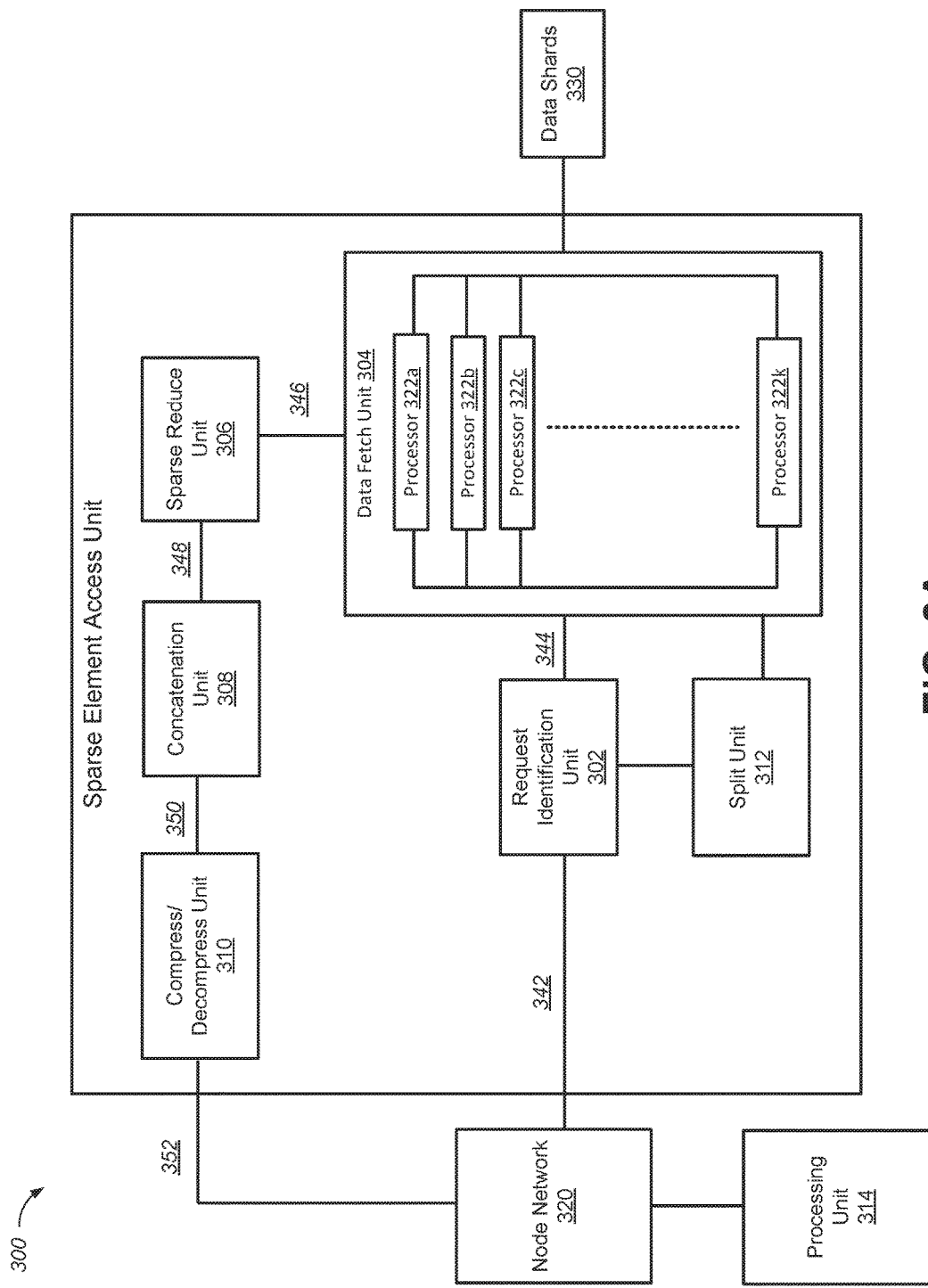
FIGS. 3A-3B illustrate an example sparse element access unit.

FIG. 3A shows an example sparse element access unit 300. The sparse element access unit 300 may be any one of the sparse element access units X1,1 to XM,N. In general, the sparse element access unit 300 is configured to receive, from the node network 320, a request 342 to fetch sparse elements stored in one or more data shards, and to transform the fetched sparse elements into a dense matrix. In some implementations, a processing unit 314 sends a request to a sparse element access unit in the node network 320 for a dense matrix generated using sparse elements. The sparse element access unit may broadcast the request 342 to the sparse element access unit 300. The routing of the broadcast request 342 may be similar to the descriptions in FIG. 2B. The sparse element access unit 300 includes a request identification unit 302, a data fetch unit 304, a sparse reduce unit 306, a concatenation unit 308, a compress/decompress unit 310, and a split unit 312. The node network 320 may be a two-dimensional mesh network. The processing unit 314 may be similar to the processing unit 102.

In general, the request identification unit 302 is configured to receive the request 342 to fetch sparse elements stored in one or more data shards 330, and determine whether the sparse element access unit 300 is assigned to access the sparse elements indicated by the request 342. In some implementations, the request identification unit 302 may determine whether the sparse element access unit 300 is assigned to access the sparse elements indicated by the request 342 by using a lookup table. For example, if an identification of a particular requested sparse element (e.g., No. 1 of database table No. 1) is included in the lookup table, the request identification unit 302 may send a signal 344 to the data fetch unit 304 to fetch the particular requested sparse element. If an identification of a particular requested sparse element (e.g., No. 1 of database table No. 1) is not included in the lookup table, the request identification unit 302 may discard the received request. In some implementations, the request identification unit 302 may be configured to broadcast the received request to another sparse element access unit on the node network 320.

The data fetch unit 304 is configured to fetch one or more requested sparse elements from the data shards 330 in response to receiving the signal 344. In some implementations, the data fetch unit 304 includes one or more processors 322a-322k, where k is an integer. Processors 322a-322k may be vector processing units (VPU), array processing units, or any suitable processing units. In some implementations, the processors 322a-322k are arranged to be near the data shards 330 to reduce the latency between the processors 322a-322k and data shards 330. Based on the number of requested sparse elements that the sparse element access unit 300 are assigned to fetch, the data fetch unit 304 may be configured to generate one or more requests to be distributed among the processors 322a-322k. In some implementations, each of the processors 322a-322k may be assigned to specific sparse elements based on the identification of the sparse elements, and the data fetch unit 304 may be configured to generate one or more requests for the processors 322a-322k based on the identification of the sparse elements. In some implementations, the data fetch unit 304 may determine the processor assignment by using a lookup table. In some implementations, the data fetch unit 304 may general multiple batches for the processors 322a-322k, where each batch is a request for a subset of the requested sparse element. The processors 322a-322k are configured to independently fetch the assigned sparse elements from the data shards 330, and to forward the fetched sparse elements 346 to the sparse reduce unit 306.

The sparse reduce unit 306 is configured to reduce the dimensions of the fetched sparse elements 346. For example, each of the processors 322a-322k may generate a sparse element having dimensions of 100-by-1. The sparse reduce unit 306 may receive fetched sparse elements 346 having dimensions of 100-by-k, and to generate sparse-reduced elements 348 by reducing the dimensions of the fetched sparse elements 346 to 100-by-1 by logic operations, arithmetic operations, or a combination of both. The sparse reduce unit 306 is configured to output the sparse-reduced elements 348 to the concatenation unit 308.

The concatenation unit 308 is configured to rearrange and concatenate the sparse-reduced elements 348 to generate concatenated elements 350. For example, The sparse element access unit $X_{1,1}$ may be configured to access sparse elements No. 1 to No. 200 of database table No. 1. Processor 322a may return the fetched sparse element No. 10 to the sparse reduce unit 306 sooner than processor 322b that is configured returns the fetched sparse element No. 5. The concatenation unit 308 is configured to rearrange the later-received sparse element No. 5 to be ordered before the earlier-received sparse element No. 10, and concatenate sparse elements No. 1 to No. 200 as the concatenated elements 350.

The compress/decompress unit 310 is configured to compress the concatenated elements 350 to generate a dense matrix 352 for the node network 320. For example, the compress/decompress unit 310 may be configure to compress the zero values in the concatenated elements 350 to improve the bandwidth of the node network 320. In some implementations, the compress/decompress unit 310 may decompress a received dense matrix. For example, the sparse element access unit 300 may receive a dense matrix from a neighboring sparse element access unit via the node network 320. The sparse element access unit 300 may decompress the received dense matrix, and may concatenate the decompressed dense matrix with the concatenated elements 350 to form updated concatenated elements that can be compressed and then output to the node network 320.

Figure 3B:
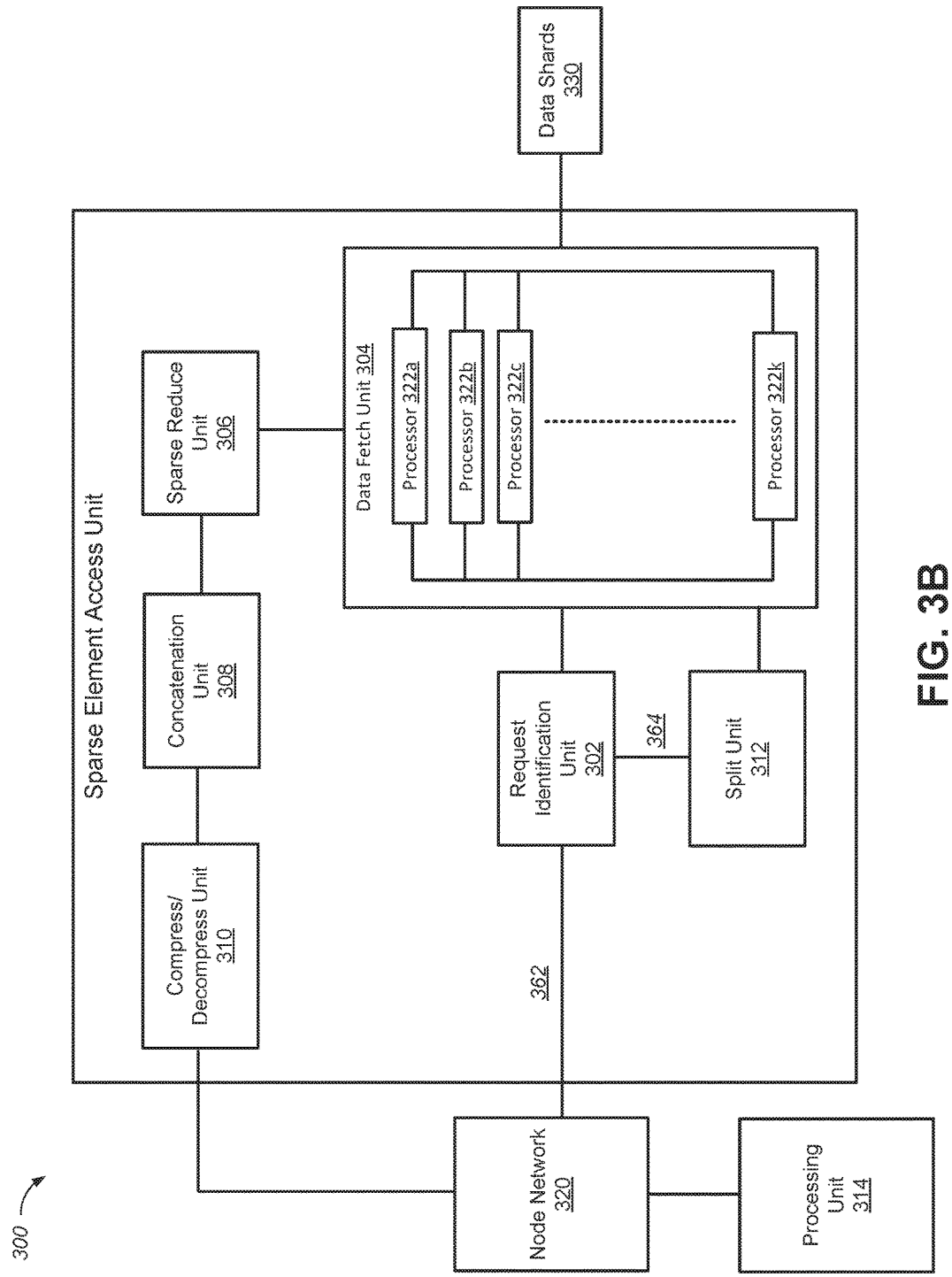

FIG. 3B shows an example of how the sparse element access unit 300 may update sparse elements based on a dense matrix received from the node network 320. As an example, a processing unit may execute an instruction requesting the sparse-dense transform unit to update the stored sparse elements using a dense one-dimensional vector generated using sparse elements No. 1 to No. 50 of database table No. 1 and sparse elements No. 9,050 to No. 9,060 of database table No. 1,000. After the sparse-dense transform unit receives the request from the processing unit, the sparse-dense transform unit may send a request 362 to instruct the sparse element access unit 300 to determine whether it is assigned to access the sparse elements included in the dense one-dimensional vector. The request identification unit 302 is configured to determine whether the sparse element access unit 300 is assigned to access the sparse elements included in the dense one-dimensional vector. In response to determining that the sparse element access unit 300 is assigned to access the sparse elements included in the dense one-dimensional vector, the request identification unit 302 may send an indication 364 to the split unit 312 to update the sparse elements stored in the data shard(s).

The split unit 312 is configured to transform a received dense matrix into sparse elements that can be updated in the data shards 330 by the data fetch unit 304. For example, the split unit 312 may be configured to transform the dense one-dimensional vector into multiple sparse elements, and instruct the data fetch unit 304 to update the sparse elements stored in the data shards 330 that the sparse element access unit 300 is assigned to fetch.

Figure 4:
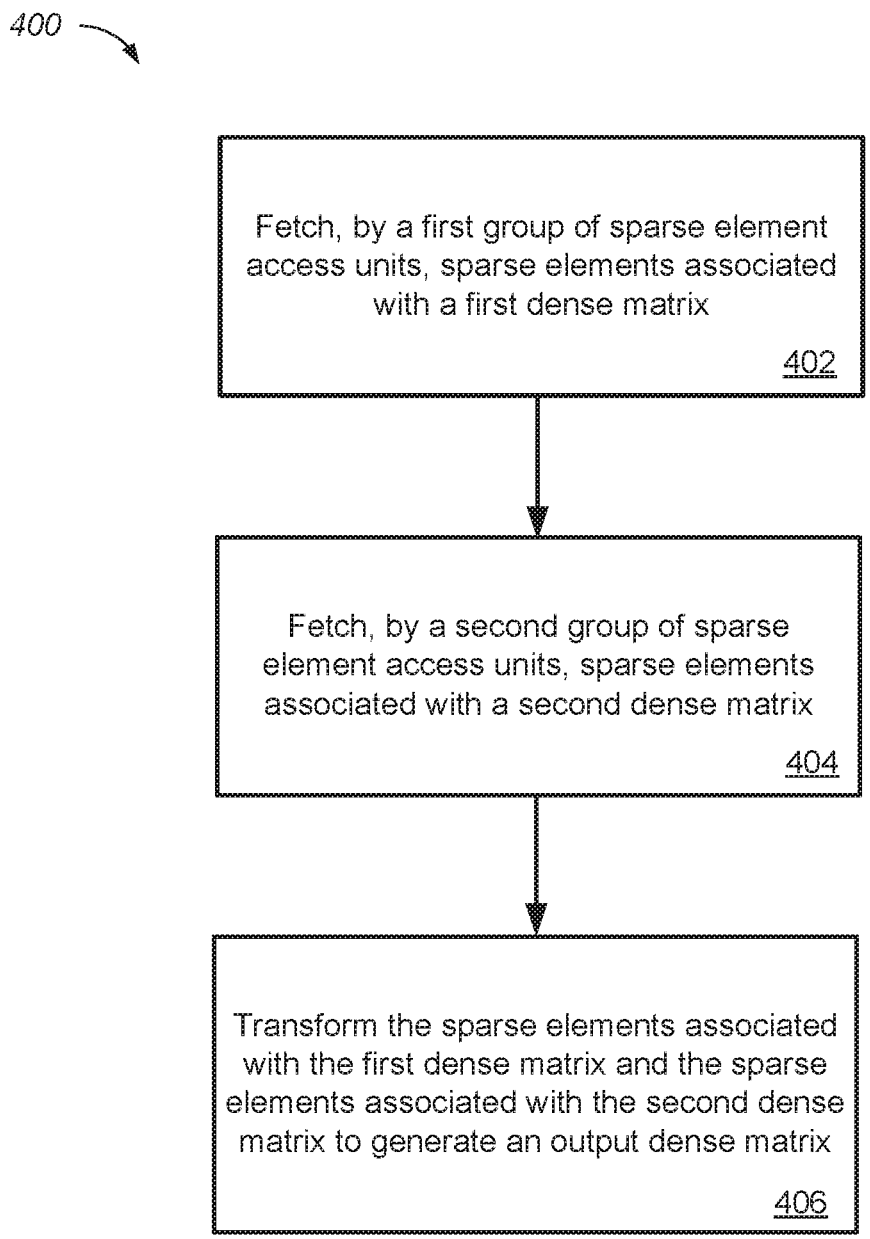
FIG. 4 is a flow diagram that illustrates an example of a process for generating a dense matrix.

FIG. 4 is a flow diagram that illustrates an example of a process 400 for generating a dense matrix. The process 400 may be performed by a system, such as the sparse-dense transform unit 104 or the sparse-dense transform unit 200. The system may include a first group of sparse element access units and a second group of sparse element access units. For example, referring to FIG. 2A, the sparse-dense transform unit 200 may include M-by-N sparse element access units $X_{1,1}$ to $X_{M,N}$ that are physically or logically arranged into M rows and N columns. Each row of the sparse element access units $X_{1,1}$ to $X_{M,N}$ may be partitioned to access sparse elements transformed from specific dense matrices. In some implementations, the first group of sparse element access units may include a first sparse element access unit and a second sparse element access unit. For example, the first row of the sparse-dense transform unit 200 may include sparse element access units $X_{1,1}$ and $X_{1,2}$. In some implementations, the first group of sparse element access units and the second group of sparse element access units may arranged in a two-dimensional mesh configuration. In some implementations, the first group of sparse element access units and the second group of sparse element access units may be arranged in a two-dimensional torus configuration.

The system receives a request for an output matrix based on sparse elements including sparse elements associated with a first dense matrix and the sparse elements associated with a second dense matrix. For example, referring to FIG. 2B, a processing unit may execute an instruction requesting the sparse-dense transform unit 200 for a dense one-dimensional vector generated using sparse elements No. 1 to No. 50 of database table No. 1, sparse elements No. 100 to No.

200 of database table No. 2, and sparse elements No. 9,050 to No. 9,060 of database table No. 1,000.

In some implementations, the first sparse element access unit may receive a request for a plurality of sparse elements including the sparse elements associated with the first dense matrix and the sparse elements associated with the second dense matrix. The first sparse element access unit may transmit the request to the second sparse element access unit. For example, referring to FIG. 2B, after the sparse-dense transform unit 200 receives the request from the processing unit, the sparse-dense transform unit 200 may instruct the sparse element access unit $X_{1,1}$ to broadcast a request for the sparse elements to the other sparse element access units in the mesh network. The sparse element access unit $X_{1,1}$ may broadcast a request 222 to the sparse element access unit $X_{1,2}$.

The system obtains the sparse elements associated with the first dense matrix fetched by a first group of sparse element access units (402). In some implementations, the first sparse element access unit may determine that an identity of a particular sparse element of the plurality of sparse elements matches with an identity of one of the first subset of the sparse elements associated with the first dense matrix. For example, referring to FIG. 2C, the sparse element access unit X1,1 may be configured to access sparse elements No. 1 to No. 200 of database table No. 1. The sparse element access unit X1,1 may determine that it is configured to access sparse elements No. 1 to No. 50 of database table No. 1, but it is not configured to access sparse elements No. 100 to No. 200 of database table No. 2 or sparse elements No. 9,050 to No. 9,060 of database table No. 1,000. In response to determining that the identity of the particular sparse element of the plurality of sparse elements matches with the identity of one of the first subset of the sparse elements associated with the first dense matrix, the first sparse element access unit may fetch the first subset of the sparse elements associated with the first dense matrix including the particular sparse element. For example, in response to determining that it is configured to access sparse elements No. 1 to No. 50 of database table No. 1, the sparse element access unit X1,1 may fetch sparse elements No. 1 to No. 50 of database table No. 1 from the data shard(s) where these sparse elements are being stored.

The second sparse element access unit may fetch a second, different, subset of the sparse elements associated with the first dense matrix. For example, referring to FIG. 2C, the sparse element access unit $X_{1,2}$ may be configured to access sparse elements No. 51 to No. 200 of database table No. 2. In response to determining that it is configured to access sparse elements No. 100 to No. 200 of database table No. 2, the sparse element access unit $X_{1,2}$ may fetch these sparse elements from the data shard(s) where these sparse elements are being stored.

The system obtains the sparse elements associated with the second dense matrix fetched by a second group of sparse element access units (404). For example, referring to FIG. 2C, the second group sparse element access units may be the M-th row of the M-by-N sparse element access units, where the sparse element access unit $X_{M,N}$ may be configured to access sparse elements No. 9,000 to No. 10,000 of database table No. 1,000. In response to determining that it is configured to access sparse elements No. 9,050 to No. 9,060 of database table No. 1,000, the sparse element access unit $X_{M,N}$ may fetch these sparse elements from the data shard(s) where these sparse elements are being stored, and generate a dense matrix 246 based on these sparse elements.

In some implementations, the first sparse element access unit may fetch the first subset of the sparse elements associated with the first dense matrix from a first data shard, and the second sparse element access unit may fetch the second, different, subset of the sparse elements associated with the first dense matrix from a second, different data shard. For example, referring to FIG. 1, the first sparse element access unit may fetch the first subset of the sparse elements associated with the first dense matrix from data shard 106a, and the second sparse element access unit may fetch the second, different, subset of the sparse elements associated with the first dense matrix from data shard 106b.

The system transforms the sparse elements associated with the first dense matrix and the sparse elements associated with the second dense matrix to generate an output dense matrix that includes the sparse elements associated with the first dense matrix and the sparse elements associated with the second dense matrix (406). For example, referring to FIG. 2C, the sparse-dense transform unit 200 may transform the dense matrices 242, 244, and 246 into a dense matrix for the processor unit.

In some implementations, the sparse elements associated with and first dense matrix and the sparse elements associated with second dense matrix may be multi-dimensional matrices, and the output dense matrix may be a vector. For example, the dense matrix 242 may have dimensions of 100-by-10, the dense matrix 244 may have dimensions of 20-by-100, and the dense matrix 246 may have dimensions of 3-by-3. The sparse-dense transform unit 200 may transform the dense matrices 242, 244, and 246 into a vector with dimensions of 1-by-3009.

Figure 5:
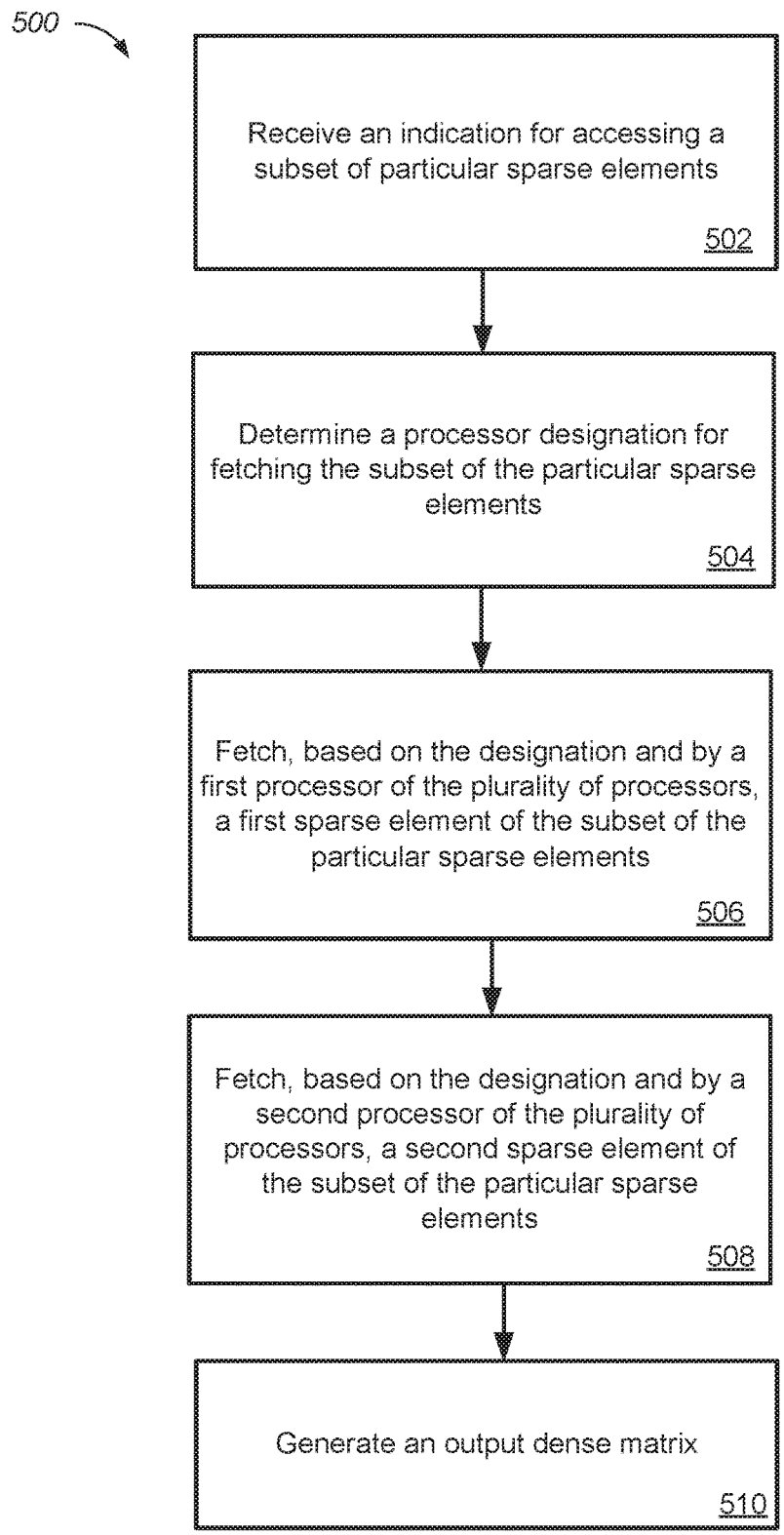
FIG. 5 is a flow diagram that illustrates an example of a process for transforming sparse elements into a dense matrix.

FIG. 5 is a flow diagram that illustrates an example of a process 500 for generating a dense matrix. The process 500 may be performed by a system, such as the sparse-dense transform unit 104 or the sparse element access unit 300.

The system receives an indication for accessing the subset of the particular sparse elements (502). For example, referring to FIG. 3A, the data fetch unit 304 may be configured to receiving a signal 344 for fetching one or more requested sparse elements from the data shards 330. In some implementations, a request for particular sparse elements that are stored in one or more data shards may be received over a node network. For example, referring to FIG. 3A, the request identification unit 302 may be configured to receive a request 342 over a node network 320 to fetch sparse elements stored in data shards 330. The system may determine that the data fetch unit is assigned to handle a subset of the particular sparse elements. For example, the request identification unit 302 may be configured to determine whether the sparse element access unit 300 is assigned to access the sparse elements indicated by the request 342. In response to determining that the data fetch unit is assigned to handle a subset of the particular sparse elements, the indication may be generated for accessing the subset of the particular sparse elements. For example, if an identification of a particular requested sparse element (e.g., No. 1 of database table No. 1) is included in a lookup table, the request identification unit 302 may send a signal 344 to the data fetch unit 304 to fetch the particular requested sparse element.

The system determines, based on identifications of the subset of the particular sparse elements, a processor designation for fetching the subset of the particular sparse elements (504). For example, referring to FIG. 3A, the data fetch unit 304 includes one or more processors 322a-322k. Each of the processors 322a-322k may be assigned to specific sparse elements based on the identification of the sparse elements, and the data fetch unit 304 may be configured to generate one or more requests for the processors 322a-322k based on the identification of the sparse elements. In some implementations, the system may determine that the system is assigned to handle the subset of the particular sparse elements comprises determining that the system is assigned to handle a subset of the particular sparse elements based on a lookup table. For example, the data fetch unit 304 may determine the processor assignment by using a lookup table.

The system fetches, based on the designation and by a first processor of the plurality of processors, a first sparse element of the subset of the particular sparse elements (506). For example, referring to FIG. 3A, the data fetch unit 304 may instruct the processor 322a to fetch a sparse element that is included in the signal 344.

The system fetches, based on the designation and by a second processor of the plurality of processors, a second sparse element of the subset of the particular sparse elements (508). For example, referring to FIG. 3A, the data fetch unit 304 may instruct the processor 322b to fetch a different sparse element that is included in the signal 344.

In some implementations, a first matrix that includes the first sparse element from the first processor may be received, where the first matrix may have a first dimension. The system may generate a second matrix that includes the first sparse element, the second matrix having a second dimension that is smaller than the first dimension. For example, the sparse reduce unit 306 may be configured to reduce the dimensions of the fetched sparse elements 346. Each of the processors 322a-322k may generate a sparse element having dimensions of 100-by-1. The sparse reduce unit 306 may receive fetched sparse elements 346 having dimensions of 100-by-k, and to generate sparse-reduced elements 348 by reducing the dimensions of the fetched sparse elements 346 to 100-by-1 by logic operations, arithmetic operations, or a combination of both. The system may generate the output dense matrix, the output dense matrix may be generated based on the second matrix. For example, the concatenation unit 308 may be configured to rearrange and concatenate the sparse-reduced elements 348 to generate concatenated elements 350.

In some implementations, the first sparse element may be received at a first point of time, and the second sparse element may be received at a second, different, point of time. The system may determine an order of the first sparse element and the second sparse element for the output dense matrix. For example, referring to FIG. 3A, processor 322a may return the fetched sparse element No. 10 to the sparse reduce unit 306 sooner than processor 322b that is configured returns the fetched sparse element No. 5. The concatenation unit 308 is configured to rearrange the later-received sparse element No. 5 to be ordered before the earlier-received sparse element No. 10, and concatenate sparse elements No. 1 to No. 200 as the concatenated elements 350.

The system generates an output dense matrix based on a transformation that is applied to at least the first sparse element and the second sparse element (510). In some implementations, the system may compress the output dense matrix to generate a compressed output dense matrix. The system may provide the compressed output dense matrix to the node network. For example, the compress/decompress unit 310 may be configured to compress the concatenated elements 350 to generate a dense matrix 352 for the node network 320.

In some implementations, the system may receive a first dense matrix representing a dense matrix sent over the node network, and generate the output dense matrix based on the first dense matrix, the first sparse element, and the second sparse element. For example, the sparse element access unit 300 may receive a dense matrix from a neighboring sparse element access unit via the node network 320. The sparse element access unit 300 may decompress the received dense matrix, and may concatenate the decompressed dense matrix with the concatenated elements 350 to form updated concatenated elements that can be compressed and then output to the node network 320.

In some implementations, the one or more sparse elements of the particular sparse elements are multi-dimensional matrices, and the output dense matrix is a vector. Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non transitory program carrier for execution by, or to control the operation of, data processing apparatus. Alternatively or in addition, the program instructions can be encoded on an artificially generated propagated signal, e.g., a machine-generated electrical, optical, or electromagnetic signal, that is generated to encode information for transmission to suitable receiver apparatus for execution by a data processing apparatus. The computer storage medium can be a machine-readable storage device, a machine-readable storage substrate, a random or serial access memory device, or a combination of one or more of them.

The term "data processing apparatus" encompasses all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network.

The processes and logic flows described in this specification can be performed by one or more programmable computers executing one or more computer programs to perform functions by operating on input data and generating output. The processes and logic flows can also be performed by, and apparatus can also be implemented as, special purpose logic circuitry, e.g., an FPGA (field programmable gate array), an ASIC (application specific integrated circuit), or a GPGPU (General purpose graphics processing unit).

Computers suitable for the execution of a computer program include, by way of example, can be based on general or special purpose microprocessors or both, or any other kind of central processing unit. Generally, a central processing unit will receive instructions and data from a read only memory or a random access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

While this specification contains many specific implementation details, these should not be construed as limitations on the scope of any invention or of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain implementations, multitasking and parallel processing may be advantageous.

What is claimed is:

1. A system for transforming sparse elements into a dense matrix, the system comprising:
   multiple sparse element access units arranged along respective dimensions of a two-dimensional sparse-dense transform unit, wherein each sparse element access unit includes:
   a respective data fetch unit comprising a respective plurality of processors, the data fetch unit configured to:
      receive, from an external source, one or more control signals that provide an indication that the sparse element access unit in which the data fetch unit is located is assigned to access a subset of particular sparse elements that are stored in one or more data shards; and
      fetch, based on the indication, one or more sparse elements of the subset of the particular sparse elements;

a respective concatenation unit configured to:
   generate an output dense matrix based on a transformation that is applied to at least the one or more sparse elements; and
a respective compress/decompress unit configured to:
   compress the output dense matrix to generate a compressed output dense matrix; and
   provide the compressed output dense matrix to a node network.

2. The system of claim 1, each sparse element access unit further comprising:
a respective request identification unit configured to:
   receive, over the node network, a request for the particular sparse elements;
   determine that the sparse element access unit in which the request identification unit is located is assigned to handle the subset of the particular sparse elements; and
   in response to determining that the sparse element access unit in which the request identification unit is located is assigned to handle the subset of the particular sparse elements, generate the indication to the data fetch unit for accessing the subset of the particular sparse elements.

3. The system of claim 2, wherein determining that the sparse element access unit in which the request identification unit is located is assigned to handle the subset of the particular sparse elements comprises determining that the sparse element access unit in which the request identification unit is located is assigned to handle a subset of the particular sparse elements based on a lookup table.

4. The system of claim 1, each sparse element access unit further comprising:
a respective sparse reduce unit configured to:
   receive a first matrix that includes a first sparse element from a first processor, the first matrix having a first dimension; and
   generate a second matrix that includes the first sparse element, the second matrix having a second dimension that is smaller than the first dimension,
wherein the concatenation unit is further configured to:
   receive the second matrix,
   wherein generating the output dense matrix further comprises generating the output dense matrix based on the second matrix.

5. The system of claim 1, wherein the concatenation unit is configured to:
receive a first sparse element at a first point of time;
receive a second sparse element at a second, different, point of time; and
determine an order of the first sparse element and the second sparse element for the output dense matrix,
wherein generating the output dense matrix further comprises generating the output dense matrix based on the order of the first sparse element and the second sparse element.

6. The system of claim 1,
wherein the concatenation unit is further configured to receive a first dense matrix representing a dense matrix sent over the node network, and
wherein generating the output dense matrix further comprises generating the output dense matrix based on the first dense matrix, a first sparse element, and a second sparse element.

7. The system of claim 6, wherein the compress/decompress unit is configured to decompress a compressed first dense matrix to generate a dense matrix that corresponds to the first dense matrix received by the concatenation unit.

8. The system of claim 1, wherein one or more sparse elements of the particular sparse elements are multi-dimensional matrices, and wherein the output dense matrix is a vector.

9. A method for transforming sparse elements into a dense matrix, comprising:
receiving, by a sparse element access unit and from an external source, one or more control signals for accessing one or more sparse elements, where multiple sparse element access units are arranged along respective dimensions of a two-dimensional sparse-dense transform unit, each sparse element access unit including a respective data fetch unit, a respective concatenation unit, and a respective compress/decompress unit;
receiving, by the respective data fetch unit having a respective plurality of processors and based on the one or more control signals, an indication that the sparse element access unit in which the data fetch unit is located is assigned to access a subset of particular sparse elements that are stored in one or more data shards;
fetching, based on the indication, one or more sparse elements of the subset of the particular sparse elements;
generating, by the respective concatenation unit, an output dense matrix based on a transformation that is applied to at least the one or more sparse elements; and
compressing, by the respective compress/decompress unit, the output dense matrix to generate a compressed output dense matrix, and providing the compressed output dense matrix to a node network.

10. The method of claim 9, further comprising:
receiving, by a sparse reduce unit, a first matrix that includes a first sparse element from a first processor, the first matrix having a first dimension;
generating, by the sparse reduce unit, a second matrix that includes the first sparse element, the second matrix having a second dimension that is smaller than the first dimension; and
receiving, by the concatenation unit, the second matrix,
wherein generating the output dense matrix further comprises generating the output dense matrix based on the second matrix.

11. The method of claim 9, wherein generating the output dense matrix further comprises:
receiving a first sparse element at a first point of time;
receiving a second sparse element at a second, different, point of time;
determining an order of the first sparse element and the second sparse element for the output dense matrix; and
generating the output dense matrix based on the order of the first sparse element and the second sparse element.

12. The method of claim 9, wherein generating the output dense matrix further comprises:
receiving a first dense matrix representing a dense matrix sent over the node network; and
generating the output dense matrix based on the first dense matrix, a first sparse element, and a second sparse element.

13. The method of claim 9, further comprising:
receiving, by a request identification unit and over the node network, a request for particular sparse elements that are stored in one or more data shards;
determining that the data fetch unit is assigned to handle a subset of the particular sparse elements; and in response to determining that the data fetch unit is assigned to handle a subset of the particular sparse elements, generating the indication for accessing the subset of the particular sparse elements.

14. The method of claim 13, wherein determining that the data fetch unit is assigned to handle the subset of the particular sparse elements comprises determining that the data fetch unit is assigned to handle a subset of the particular sparse elements based on a lookup table.

15. A system for transforming sparse elements to a dense matrix, the system comprising:
   one or more processors configured to send a request for an output matrix based on particular sparse elements that are stored in one or more data shards;
   plurality of sparse element access units connected over a node network and arranged along respective dimensions of a two-dimensional sparse-dense transform unit, wherein each sparse element access unit includes:
      a respective data fetch unit comprising a respective plurality of processors, the data fetch unit configured to:
         receive, from an external source, one or more control signals that provide an indication that the sparse element access unit in which the data fetch unit is located is assigned to access a subset of the particular sparse elements; and
         fetch, based on the indication, one or more sparse elements of the subset of the particular sparse elements;
      a respective concatenation unit configured to:
      generate an output dense matrix based on a transformation that is applied to at least the one or more sparse elements; and
      a respective compress/decompress unit configured to:
         compress the output dense matrix to generate a compressed output dense matrix; and
         provide the compressed output dense matrix to the node network.

16. The system of claim 15, each sparse element access unit further comprising:
   a respective request identification unit configured to:
      receive, over the node network, the request for the particular sparse elements; and
      determine that the sparse element access unit in which the request identification unit is located is assigned to handle the subset of the particular sparse elements; and
      in response to determining that the sparse element access unit in which the request identification unit is located is assigned to handle a subset of the particular sparse elements, generate, to the data fetch unit, the indication for accessing the subset of the particular sparse elements.

17. The system of claim 15, each sparse element access unit further comprising:
   a respective sparse reduce unit configured to:
      receive a first matrix that includes a first sparse element from a first processor, the first matrix having a first dimension; and
      generate a second matrix that includes the first sparse element, the second matrix having a second dimension that is smaller than the first dimension,
   wherein the concatenation unit is further configured to:
      receive the second matrix,
   wherein generating the output dense matrix further comprises generating the output dense matrix based on the second matrix.

* * * * *